United States Patent
Elaasar

(10) Patent No.: US 12,549,132 B2
(45) Date of Patent: Feb. 10, 2026

(54) TRANSFORMER BASED FILTER FOR COMPLEMENTARY OSCILLATOR CIRCUITRY

(71) Applicant: Apple Inc., Cupertino, CA (US)

(72) Inventor: Omar E Elaasar, San Diego, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 18/653,927

(22) Filed: May 2, 2024

(65) Prior Publication Data
US 2025/0343510 A1  Nov. 6, 2025

(51) Int. Cl.
*H03B 5/12* (2006.01)
*H03H 7/01* (2006.01)

(52) U.S. Cl.
CPC ......... *H03B 5/1296* (2013.01); *H03B 5/1212* (2013.01); *H03B 5/124* (2013.01); *H03H 7/0115* (2013.01)

(58) Field of Classification Search
CPC .... H03B 5/1296; H03B 5/1212; H03B 5/124; H03H 7/0115
See application file for complete search history.

(56) References Cited

U.S. PATENT DOCUMENTS

| | | | |
|---|---|---|---|
| 7,386,286 B2 | 6/2008 | Petrovic et al. | |
| 7,847,650 B2 | 12/2010 | Yao et al. | |
| 8,258,877 B2 | 9/2012 | Goel et al. | |
| 9,374,036 B2 | 6/2016 | Ximenes et al. | |
| 9,490,745 B1 * | 11/2016 | Toso | H03B 5/1228 |
| 9,831,847 B2 | 11/2017 | Babaie et al. | |
| 2019/0158022 A1 * | 5/2019 | Issakov | H03B 5/1215 |

* cited by examiner

*Primary Examiner* — Jeffrey M Shin
(74) *Attorney, Agent, or Firm* — Treyz Law Group; Jason Tsai

(57) ABSTRACT

An electronic device may include wireless circuitry having an oscillator. The oscillator can include a pair of n-type transistors coupled to a first tail node, a pair of p-type transistors coupled to a second tail node, a load inductor coupled between the pair of n-type transistors and the pair of p-type transistors, a load capacitor coupled between the pair of n-type transistors and the pair of p-type transistors, a tunable capacitor, and a first transformer coupled between the first tail node and the tunable capacitor. The oscillator can further include a second transformer coupled between the second tail node and the tunable capacitor. The tunable capacitor can include multiple differential switchable capacitor circuits.

19 Claims, 7 Drawing Sheets

US 12,549,132 B2

TRANSFORMER BASED FILTER FOR COMPLEMENTARY OSCILLATOR CIRCUITRY

FIELD

This disclosure relates generally to electronic devices and, more particularly, to electronic devices with wireless communications circuitry.

BACKGROUND

Electronic devices can be provided with wireless communications capabilities. An electronic device with wireless communications capabilities has wireless communications circuitry with one or more antennas. Wireless communications circuitry in the wireless communications circuitry uses the antennas to receive and transmit radio-frequency signals.

The wireless communications circuitry can include a transceiver having one or more mixers. A mixer in the transmit path can be used to modulate signals from a baseband frequency to a radio frequency, whereas a mixer in the receive path can be used to demodulate signals from the radio-frequency to the baseband frequency. Mixers receive clock signals generated from local oscillator circuitry. It can be challenging to design satisfactory local oscillator circuitry for an electronic device.

SUMMARY

An aspect of the disclosure provides circuitry that includes a pair of n-type transistors coupled to a first tail node, a pair of p-type transistors coupled to a second tail node, a load inductor coupled between the pair of n-type transistors and the pair of p-type transistors, a load capacitor coupled between the pair of n-type transistors and the pair of p-type transistors, a tunable capacitor, and a first transformer coupled between the first tail node and the tunable capacitor. The circuitry can further include a second transformer coupled between the second tail node and the tunable capacitor. The first transformer can include a first tail coil having a first terminal coupled to the first tail node and having a second terminal coupled to a first power supply line and a first filter coil having a first terminal coupled to the tunable capacitor and having a second terminal coupled to a node. The second transformer can include a second tail coil having a first terminal coupled to the second tail node and having a second terminal coupled to a second power supply line different than the first power supply line and a second filter coil having a first terminal coupled to the tunable capacitor and having a second terminal coupled to the node. The first tail coil and the first filter coil can be vertically stacked with respect to each other in an interconnect stack. The second tail coil and the second filter coil can be vertically stacked with respect to each other in the interconnect stack.

An aspect of the disclosure provides oscillator circuitry that includes a first pair of cross-coupled transistors, a second pair of cross-coupled transistors, a load inductor coupled to the first and second pairs of cross-coupled transistors, a load capacitor coupled to the first and second pairs of cross-coupled transistors, and a transformer based tail filter coupled between the first and second pairs of cross-coupled transistors. The transformer based tail filter can include a first tail coil coupled to the first pair of cross-coupled transistors, a second tail coil coupled to the second pair of cross-coupled transistors, a first filter coil inductively coupled to the first tail coil, a second filter coil inductively coupled to the second tail coil, and a tunable capacitor having a first terminal coupled to the first filter coil and having a second terminal coupled to the second filter coil.

An aspect of the disclosure provides oscillator circuitry that includes a first n-type transistor having a source terminal coupled to a first tail node and having a drain terminal coupled to a first output terminal, a second n-type transistor having a source terminal coupled to the first tail node and having a drain terminal coupled to a second output terminal, a first p-type transistor having a source terminal coupled to a second tail node and having a drain terminal coupled to the first output terminal, a second p-type transistor having a source terminal coupled to the second tail node and having a drain terminal coupled to the second output terminal, a first tail coil having a first terminal coupled to the first tail node and having a second terminal coupled to a first power supply line, and a first filter coil inductively coupled to the first tail coil. The oscillator circuitry can further include a second tail coil having a first terminal coupled to the second tail node and having a second terminal coupled to a second power supply line different than the first power supply line, a second filter coil inductively coupled to the second tail coil, and a tunable capacitor having a first terminal coupled to the first filter coil and having a second terminal coupled to the second filter coil. The first and second filter coils can be coupled together at a node configured as an alternating current (AC) ground node.

DETAILED DESCRIPTION

Figure 1:
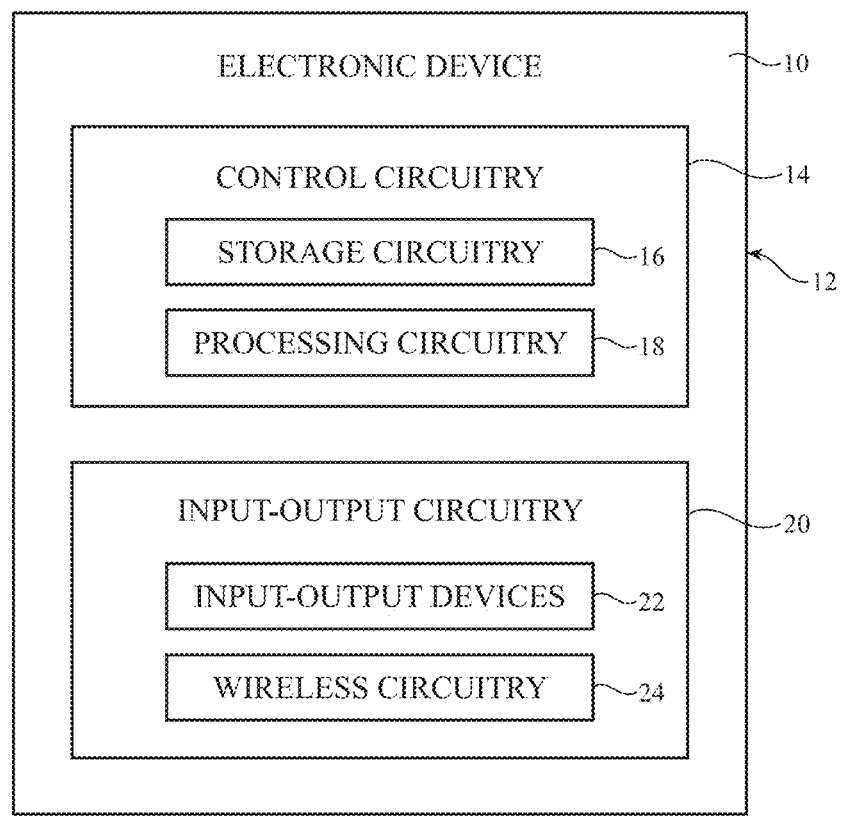
FIG. 1 is a diagram of an illustrative electronic device having wireless circuitry in accordance with some embodiments.

An electronic device such as electronic device 10 of FIG. 1 may be provided with wireless circuitry. The wireless circuitry can include one or more mixers and oscillator circuitry configured to generate oscillating signals or clock signals that are supplied to the one or more mixers. The oscillator circuitry can be a voltage controlled oscillator (VCO) having one or more inductors and a tunable capacitor. Such type of voltage controlled oscillator is sometimes referred to as an "LC" (inductor-capacitor) VCO. An LC VCO can include both n-type transistors and p-type transistors; such type of LC VCO is sometimes referred to as a "complementary" LC VCO. The n-type transistors can be coupled to a first power supply line via a first tail inductor, whereas the p-type transistors can be coupled to a second power supply line via a second tail inductor. The first and second power supply lines can be coupled to a decoupling network having associated inductance and capacitance.

In accordance with an embodiment, a complementary LC VCO can be provided with a transformer based tail filter or resonator that is coupled between the n-type transistors and p-type transistors. The transformer based tail resonator can include a tunable capacitor. The transformer based tail filter can be configured to reduce the sensitivity/impact of the decoupling network inductance by referring the tunable capacitor exactly between the plus and minus terminals of the tail inductors through a one-to-one (1:1) impedance transformer. Arranged in this way, the resonance of the tail filter becomes less dependent on the decoupling network inductance and capacitance, which allows the second harmonic power to flow through the transformer based filter rather than through the decoupling network, thus resulting in improved phase noise suppression.

Electronic device 10 of FIG. 1 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the functional block diagram of FIG. 1, device 10 may include components located on or within an electronic device housing such as housing 12. Housing 12, which may sometimes be referred to as a case, may be formed from plastic, glass, ceramics, fiber composites, metal (e.g., stainless steel, aluminum, metal alloys, etc.), other suitable materials, or a combination of these materials. In some embodiments, parts or all of housing 12 may be formed from dielectric or other low-conductivity material (e.g., glass, ceramic, plastic, sapphire, etc.). In other embodiments, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more microprocessors, microcontrollers, digital signal processors, host processors, baseband processor integrated circuits, application specific integrated circuits, central processing units (CPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols-sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 5G protocols, etc.), antenna diversity protocols, satellite navigation system protocols (e.g., global positioning system (GPS) protocols, global navigation satellite system (GLONASS) protocols, etc.), antenna-based spatial ranging protocols (e.g., radio detection and ranging (RADAR) protocols or other desired range detection protocols for signals conveyed at millimeter and centimeter wave frequencies), or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays (e.g., touch-sensitive and/or force-sensitive displays), light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless circuitry 24 to support wireless communications. Wireless circuitry 24 (sometimes referred to herein as wireless communications circuitry 24) may include one or more antennas. Wireless circuitry 24 may also include baseband processor circuitry, transceiver circuitry, amplifier circuitry, filter circuitry, switching circuitry, radio-frequency transmission lines, and/or any other circuitry for transmitting and/or receiving radio-frequency signals using the antenna(s).

Wireless circuitry 24 may transmit and/or receive radio-frequency signals within a corresponding frequency band at radio frequencies (sometimes referred to herein as a communications band or simply as a "band"). The frequency bands handled by wireless circuitry 24 may include wireless local area network (WLAN) frequency bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHZ), a Wi-Fi® 6E band (e.g., from 5925-7125 MHZ), and/or other Wi-Fi® bands (e.g., from 1875-5160 MHZ), wireless personal area network (WPAN) frequency bands such as the 2.4 GHz Bluetooth® band or other WPAN communications bands, cellular telephone frequency bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), other centimeter or millimeter wave frequency bands between 10-300 GHz, near-field communications frequency bands (e.g., at 13.56 MHZ), satellite navigation frequency bands (e.g., a GPS band from 1565 to 1610 MHz, a Global Navigation Satellite System (GLONASS) band, a BeiDou Navigation Satellite System (BDS) band, etc.), ultra-wideband (UWB) frequency bands that operate under the IEEE 802.15.4 protocol and/or other ultra-wideband communications protocols, communications bands under the family of 3GPP wireless communications standards, communications bands under the IEEE 802.XX family of standards, and/or any other desired frequency bands of interest.

Figure 2:
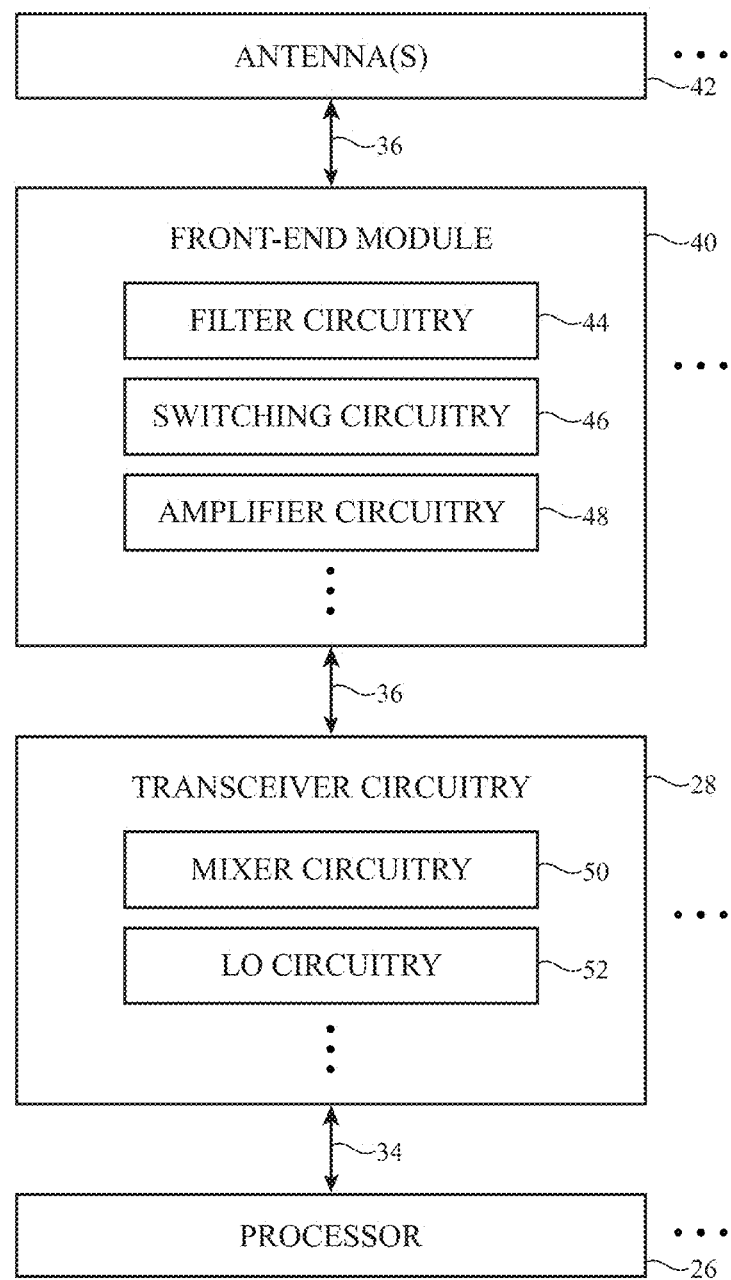
FIG. 2 is a diagram of illustrative wireless circuitry having oscillator circuitry in accordance with some embodiments.

FIG. 2 is a diagram showing illustrative components within wireless circuitry 24. Wireless circuitry 24 can include, as part of oscillator circuitry 52, a balun phase noise filter with improved phase noise suppression capabilities. As shown in FIG. 2, wireless circuitry 24 may include one or more processors such as processing circuitry 26, radio-frequency (RF) transceiver circuitry such as radio-frequency transceiver 28, radio-frequency front end circuitry such as radio-frequency front end module (FEM) 40, and antenna(s) 42. Processing circuitry 26 may be baseband processing circuitry, one or more application processor, one or more digital signal processor, one or more microcontroller, one or more microprocessor, one or more central processing unit (CPU), one or more programmable device, a combination of these circuits, and/or other types of processors within circuitry 18. Processing circuitry 26 may be configured to generate digital (transmit or baseband) signals. Processing circuitry 26 may be coupled to transceiver 28 over path 34 (sometimes referred to as a baseband path). Transceiver 28 may be coupled to antenna 42 via radio-frequency transmission line path 36. Radio-frequency front end module 40 may be interposed on radio-frequency transmission line path 36 between transceiver 28 and antenna 42.

Wireless circuitry 24 may include one or more antennas such as antenna 42. Antenna 42 may be formed using any desired antenna structures. For example, antenna 42 may be an antenna with a resonating element that is formed from loop antenna structures, patch antenna structures, inverted-F antenna structures, slot antenna structures, planar inverted-F antenna structures, helical antenna structures, monopole antennas, dipoles, hybrids of these designs, etc. Two or more antennas 42 may be arranged into one or more phased antenna arrays (e.g., for conveying radio-frequency signals at millimeter wave frequencies). Parasitic elements may be included in antenna 42 to adjust antenna performance. Antenna 42 may be provided with a conductive cavity that backs the antenna resonating element of antenna 42 (e.g., antenna 42 may be a cavity-backed antenna such as a cavity-backed slot antenna).

In the example of FIG. 2, wireless circuitry 24 is illustrated as including processing circuitry 26, a single transceiver 28, a single front end module 40, and a single antenna 42 for the sake of clarity. In general, wireless circuitry 24 may include any desired number of processors 26, any desired number of transceivers 28, any desired number of front end modules 40, and any desired number of antennas 42. Each processor 26 may be coupled to one or more transceiver 28 over respective paths 34. Each transceiver 28 may include a transmitter circuit configured to output uplink signals to antenna 42, may include a receiver circuit configured to receive downlink signals from antenna 42, and may be coupled to one or more antennas 42 over respective radio-frequency transmission line paths 36. Each radio-frequency transmission line path 36 may have a respective front end module 40 disposed thereon. If desired, two or more front end modules 40 may be disposed on the same radio-frequency transmission line path 36. If desired, one or more of the radio-frequency transmission line paths 36 in wireless circuitry 24 may be implemented without any front end module interposed thereon.

Front end module (FEM) 40 may include radio-frequency front end circuitry that operates on the radio-frequency signals conveyed (transmitted and/or received) over radio-frequency transmission line path 36. Front end module may, for example, include front end module (FEM) components such as radio-frequency filter circuitry 44 (e.g., low pass filters, high pass filters, notch filters, band pass filters, multiplexing circuitry, duplexer circuitry, diplexer circuitry, triplexer circuitry, etc.), switching circuitry 46 (e.g., one or more radio-frequency switches), radio-frequency amplifier circuitry 48 (e.g., one or more power amplifiers and one or more low-noise amplifiers), impedance matching circuitry (e.g., circuitry that helps to match the impedance of antenna 42 to the impedance of radio-frequency transmission line 36), antenna tuning circuitry (e.g., networks of capacitors, resistors, inductors, and/or switches that adjust the frequency response of antenna 42), radio-frequency coupler circuitry, charge pump circuitry, power management circuitry, digital control and interface circuitry, and/or any other desired circuitry that operates on the radio-frequency signals transmitted and/or received by antenna 42. Each of the front end module components may be mounted to a common (shared) substrate such as a rigid printed circuit board substrate or flexible printed circuit substrate. If desired, the various front end module components may also be integrated into a single integrated circuit chip.

Filter circuitry 44, switching circuitry 46, amplifier circuitry 48, and other circuitry may be interposed within radio-frequency transmission line path 36, may be incorporated into FEM 40, and/or may be incorporated into antenna 42 (e.g., to support antenna tuning, to support operation in desired frequency bands, etc.). These components, sometimes referred to herein as antenna tuning components, may be adjusted (e.g., using control circuitry 14) to adjust the frequency response and wireless performance of antenna 42 over time.

Radio-frequency transmission line path 36 may be coupled to an antenna feed on antenna 42. The antenna feed may, for example, include a positive antenna feed terminal and a ground antenna feed terminal. Radio-frequency transmission line path 36 may have a positive transmission line signal path such that is coupled to the positive antenna feed terminal on antenna 42. Radio-frequency transmission line path 36 may have a ground transmission line signal path that is coupled to the ground antenna feed terminal on antenna 42. This example is illustrative and, in general, antennas 42 may be fed using any desired antenna feeding scheme. If desired, antenna 42 may have multiple antenna feeds that are coupled to one or more radio-frequency transmission line paths 36.

Radio-frequency transmission line path 36 may include transmission lines that are used to route radio-frequency antenna signals within device 10 (FIG. 1). Transmission lines in device 10 may include coaxial cables, microstrip transmission lines, stripline transmission lines, edge-coupled microstrip transmission lines, edge-coupled stripline transmission lines, transmission lines formed from combinations of transmission lines of these types, etc. Transmission lines in device 10 such as transmission lines in radio-frequency transmission line path 36 may be integrated into rigid and/or flexible printed circuit boards. In one suitable arrangement, radio-frequency transmission line paths such as radio-frequency transmission line path 36 may also include transmission line conductors integrated within multilayer laminated structures (e.g., layers of a conductive material such as copper and a dielectric material such as a resin that are laminated together without intervening adhesive). The multilayer laminated structures may, if desired, be folded or bent in multiple dimensions (e.g., two or three dimensions) and may maintain a bent or folded shape after bending (e.g., the multilayer laminated structures may be folded into a particular three-dimensional shape to route around other device components and may be rigid enough to hold its shape after folding without being held in place by stiffeners or other structures). All of the multiple layers of the laminated structures may be batch laminated together (e.g., in a single pressing process) without adhesive (e.g., as opposed to performing multiple pressing processes to laminate multiple layers together with adhesive).

Transceiver circuitry 28 may include wireless local area network transceiver circuitry that handles WLAN communications bands (e.g., Wi-Fi® (IEEE 802.11) or other WLAN communications bands) such as a 2.4 GHz WLAN band (e.g., from 2400 to 2480 MHZ), a 5 GHZ WLAN band (e.g., from 5180 to 5825 MHZ), a Wi-Fi® 6E band (e.g., from 5925-7125 MHZ), and/or other Wi-Fi® bands (e.g., from 1875-5160 MHz), wireless personal area network transceiver circuitry that handles the 2.4 GHz Bluetooth® band or other WPAN communications bands, cellular telephone transceiver circuitry that handles cellular telephone bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), near-field communications (NFC) transceiver circuitry that handles near-field communications bands (e.g., at 13.56 MHZ), satellite navigation receiver circuitry that handles satellite navigation bands (e.g., a GPS band from 1565 to 1610 MHz, a Global Navigation Satellite System (GLONASS) band, a BeiDou Navigation Satellite System (BDS) band, etc.), ultra-wideband (UWB) transceiver circuitry that handles communications using the IEEE 802.15.4 protocol and/or other ultra-wideband communications protocols, and/or any other desired radio-frequency transceiver circuitry for covering any other desired communications bands of interest.

In performing wireless transmission, processor 26 may provide digital signals to transceiver 28 over path 34. Transceiver 28 may further include circuitry for converting the baseband signals received from processor 26 into corresponding intermediate frequency or radio-frequency signals. For example, transceiver circuitry 28 may include mixer circuitry 50 for up-converting (or modulating) the baseband signals to intermediate frequencies or radio frequencies prior to transmission over antenna 42. Transceiver circuitry 28 may also include digital-to-analog converter (DAC) and/or analog-to-digital converter (ADC) circuitry for converting signals between digital and analog domains. Transceiver 28 may include a transmitter component to transmit the radio-frequency signals over antenna 42 via radio-frequency transmission line path 36 and front end module 40. Antenna 42 may transmit the radio-frequency signals to external wireless equipment by radiating the radio-frequency signals into free space.

In performing wireless reception, antenna 42 may receive radio-frequency signals from external wireless equipment. The received radio-frequency signals may be conveyed to transceiver 28 via radio-frequency transmission line path 36 and front end module 40. Transceiver 28 may include circuitry for converting the received radio-frequency signals into corresponding intermediate frequency or baseband signals. For example, transceiver 28 may use mixer circuitry 50 for downconverting (or demodulating) the received radio-frequency signals to baseband frequencies prior to conveying the received signals to processor 26 over path 34.

Mixer circuitry 50 can include local oscillator circuitry such as local oscillator (LO) circuitry 52. Local oscillator circuitry 52 can generate oscillator or oscillating signals that mixer circuitry 50 uses to modulate transmitting signals from baseband frequencies to radio frequencies and/or to demodulate the received signals from radio frequencies to baseband or intermediate frequencies. Local oscillator circuitry 52 can generally include phase-locked loop (PLL) circuitry configured to generate the oscillating signals being fed to inputs of mixer circuitry 50.

In practice, phase noise in this local oscillator path can have a direct impact on the signal-to-noise and distortion ratio (SNDR), which, if care is not taken, can degrade the error vector magnitude (EVM) of wireless circuitry 24. As state-of-the-art modulation schemes impose more stringent EVM requirements, the phase noise in the oscillator path can become a dominant factor in the overall link budget. The PLL circuitry can include an oscillator such as a voltage controlled oscillator (VCO). It can be challenging to design a VCO for wireless circuitry 24.

Figure 3:
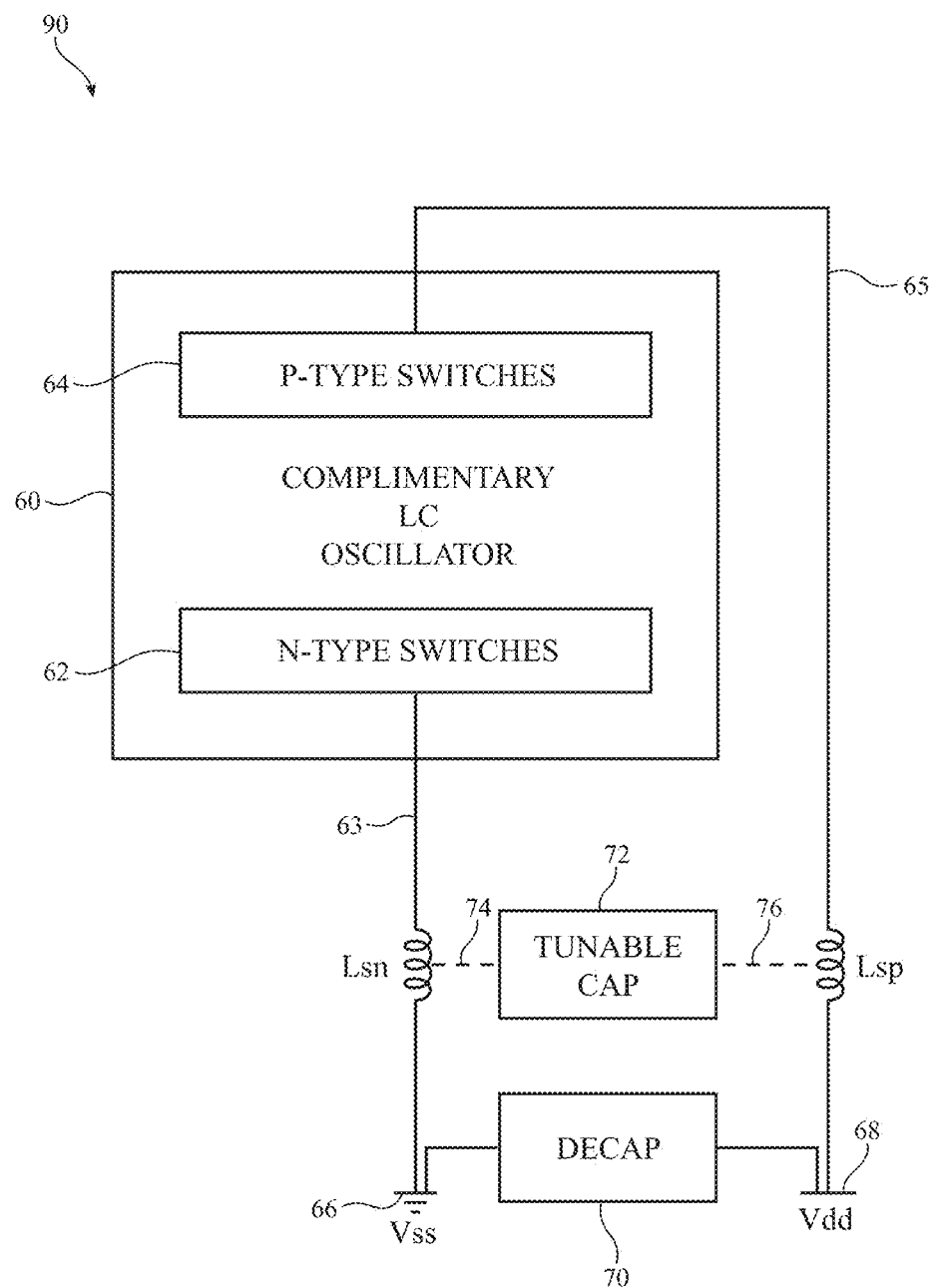
FIG. 3 is a diagram of illustrative complementary oscillator circuitry having a transformer based tail filter in accordance with some embodiments.

FIG. 3 is a diagram of illustrative oscillator circuitry such as oscillator circuitry 90 having a transformer based tail filter in accordance with some embodiments. Oscillator circuitry 90 can represent an oscillator such as a voltage controlled oscillator (VCO) that may be part of a phase-locked loop (PLL) for generating oscillating signals in LO circuitry 52. As shown in FIG. 3, oscillator circuitry 90 may include an oscillator subcircuit 60 that includes inductor (L) and capacitor (C) components and is thus sometimes referred to herein as an "LC" oscillator subcircuit or portion. Oscillator subcircuit 60 may further include n-type switches such as n-type transistors 62 and p-type switches such as p-type transistors 64. Oscillator subcircuit 60 that includes both n-type transistors and p-type transistors is sometimes referred to and defined herein as a "complementary" oscillator subcircuit.

In the example of FIG. 3, the n-type transistors 62 can be coupled to a first tail coil such as first tail coil Lsn via connection path 63. The first tail coil Lsn can have a first terminal coupled to the n-type transistors 62 and a second terminal coupled to a ground power supply line 66 (e.g., a ground power supply terminal on which ground voltage Vss is provided). Tail coil Lsn having one side coupled to a power supply line can be referred to as a "single-ended" coil or inductor. On the other end, the p-type transistors 64 can be coupled to another tail coil such as second tail coil Lsp via connection path 65. The second tail coil Lsp can have a first terminal coupled to the p-type transistors 64 and a second terminal coupled to a positive power supply line 68 (e.g., a positive power supply terminal on which positive power supply voltage Vdd is provided). Tail coil Lsp having one side coupled to a power supply line can also be referred to as a "single-ended" coil or inductor.

In accordance with an embodiment, the single-ended tail coils Lsn and Lsp can be coupled to an adjustable capacitance such as tunable capacitor 72. As shown in FIG. 3, tail coil Lsn can be coupled to tunable capacitor 72 via a first inductive coupling path 74, whereas tail coil Lsp can be coupled to tunable capacitor 72 via a second inductive coupling path 76. Tunable capacitor 72 can be implemented as a bank of capacitors, as a plurality of switchable capacitors, or as other types of programmable or adjustable capacitance.

In practice, power supply lines 66 and 68 are coupled to a decoupling network such as decoupling network 70. Decoupling network 70 can include a network of decoupling capacitors configured to ensure stable voltage levels and to reduce noise and unwanted transient responses on the power supply lines 66 and 68. Decoupling network 70 is thus sometimes referred to as a decoupling capacitance or "decap" network. Oscillator circuitry 90 of the type shown in FIG. 3 that includes a complementary LC oscillator portion 60 is thus sometimes referred to herein as complementary LC oscillator (VCO) circuitry.

Figure 4:
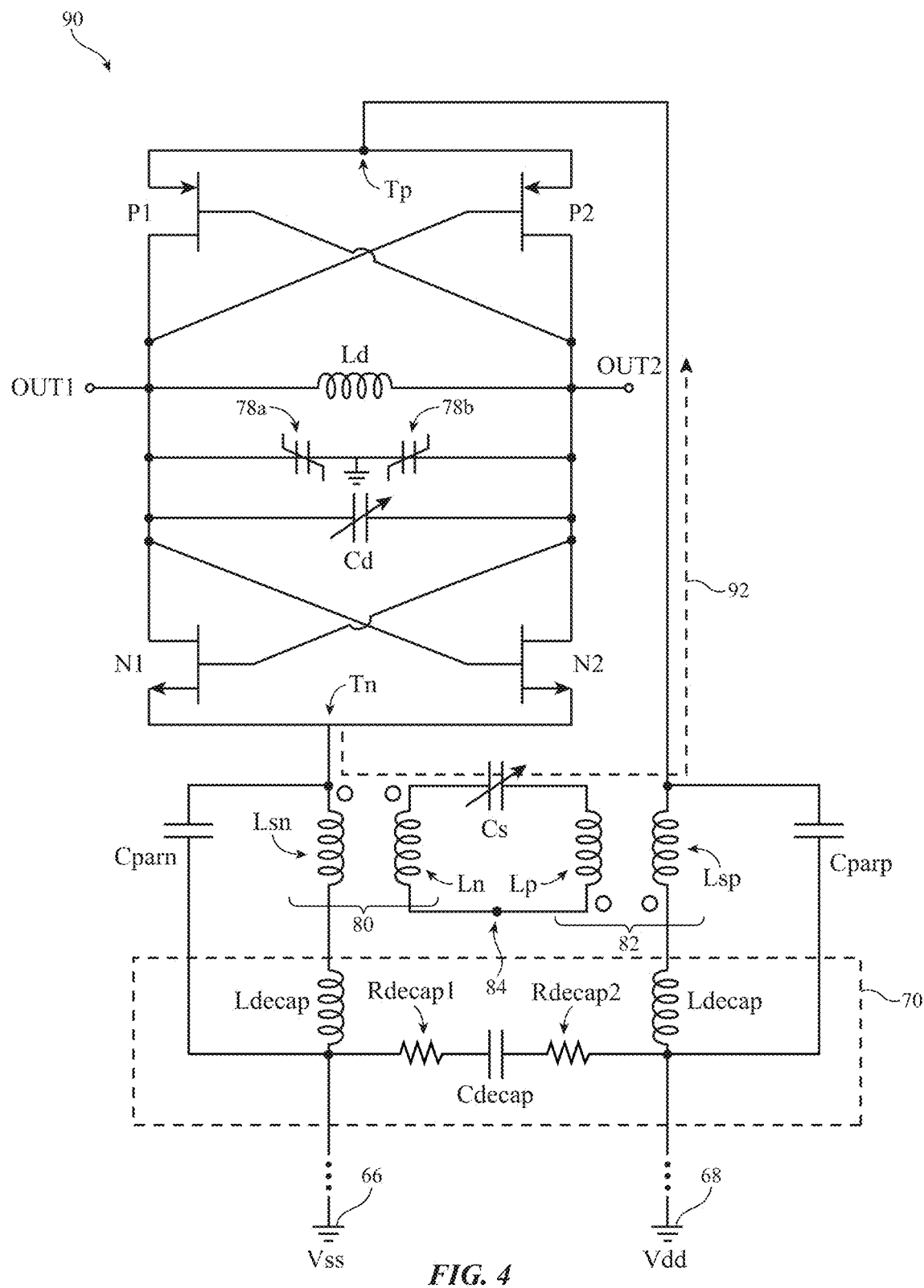
FIG. 4 is a circuit diagram showing an illustrative implementation of the complementary oscillator circuitry of FIG. 3 in accordance with some embodiments.

FIG. 4 is a circuit diagram showing an illustrative implementation of complementary LC oscillator circuitry 90 of the type described in connection with FIG. 3. As shown in FIG. 4, oscillator circuitry 90 can include n-type transistors N1 and N2, p-type transistors P1 and P2, capacitors 78a and 78b, an output capacitor such as tunable load capacitor Cd, an output inductor such as load inductor Ld, and one or more associated coils such as tail coils Lsn and Lsp.

Transistors N1 and N2 may be n-type (n-channel) transistors such as n-type metal-oxide-semiconductor (NMOS) devices and can represent the n-type switches 62 shown in FIG. 3. Transistor N1 may have a source terminal coupled to a first tail node such as tail node Tn, a drain terminal coupled to a first output terminal OUT1 of circuitry 90, and a gate terminal that is cross-coupled to a second output terminal OUT2 of circuitry 90. Transistor N2 may have a source terminal coupled to the first tail node Tn, a drain terminal coupled to the second output terminal OUT2, and a gate terminal that is cross-coupled to the first output terminal OUT1. Output terminals OUT1 and OUT2 may serve collectively as a differential output port of oscillator circuitry 90. Oscillating (LO) signals can be generated on the differential output port. Transistors N1 and N2 arranged in this way are sometimes referred to as cross-coupled differential n-type transistors.

The terms "source" and "drain" terminals used to refer to current-conveying terminals of a transistor may be used interchangeably and are sometimes referred to as "source-drain" terminals. Thus, the source terminal of transistor N1 can sometimes be referred to as a first source-drain terminal, and the drain terminal of transistor N1 can be referred to as a second source-drain terminal (or vice versa). The term "activate" with respect to a switch (or transistor) may refer to or be defined herein as an action that places the switch in an "on" or low-impedance state such that the two terminals of the switch are electrically connected to conduct current. The term "deactivate" with respect to a switch (or transistor) may refer to or be defined herein as an action that places the switch in an "off" or high-impedance state such that the two terminals of the switch/transistor are electrically disconnected with minimal leakage current.

On the other end, transistors P1 and P2 may be p-type (p-channel) transistors such as p-type metal-oxide-semiconductor (PMOS) devices and can represent the p-type switches 64 shown in FIG. 3. Transistor P1 may have a source terminal coupled to a second tail node such as tail node Tp, a drain terminal coupled to the first output terminal OUT1 of circuitry 90, and a gate terminal that is cross-coupled to the second output terminal OUT2 of circuitry 90. Transistor P2 may have a source terminal coupled to the second tail node Tp, a drain terminal coupled to the second output terminal OUT2, and a gate terminal that is cross-coupled to the first output terminal OUT1. Transistors P1 and P2 arranged in this way are sometimes referred to as cross-coupled differential p-type transistors.

A first capacitor 78a may have a first terminal coupled to output terminal OUT1 and a second terminal coupled to the ground line. A second capacitor 78b may have a first terminal coupled to output terminal OUT2 and a second terminal coupled to ground. Load (output) inductor Ld may have a first terminal coupled to output terminal OUT1 and a second terminal coupled to output terminal OUT2. Tunable load (output) capacitor Cd may have a first terminal coupled to output terminal OUT1 and a second terminal coupled to output terminal OUT2. Capacitor Cd may have implemented as a programmable bank of capacitors or other types of adjustable capacitive structure.

Figure 7:
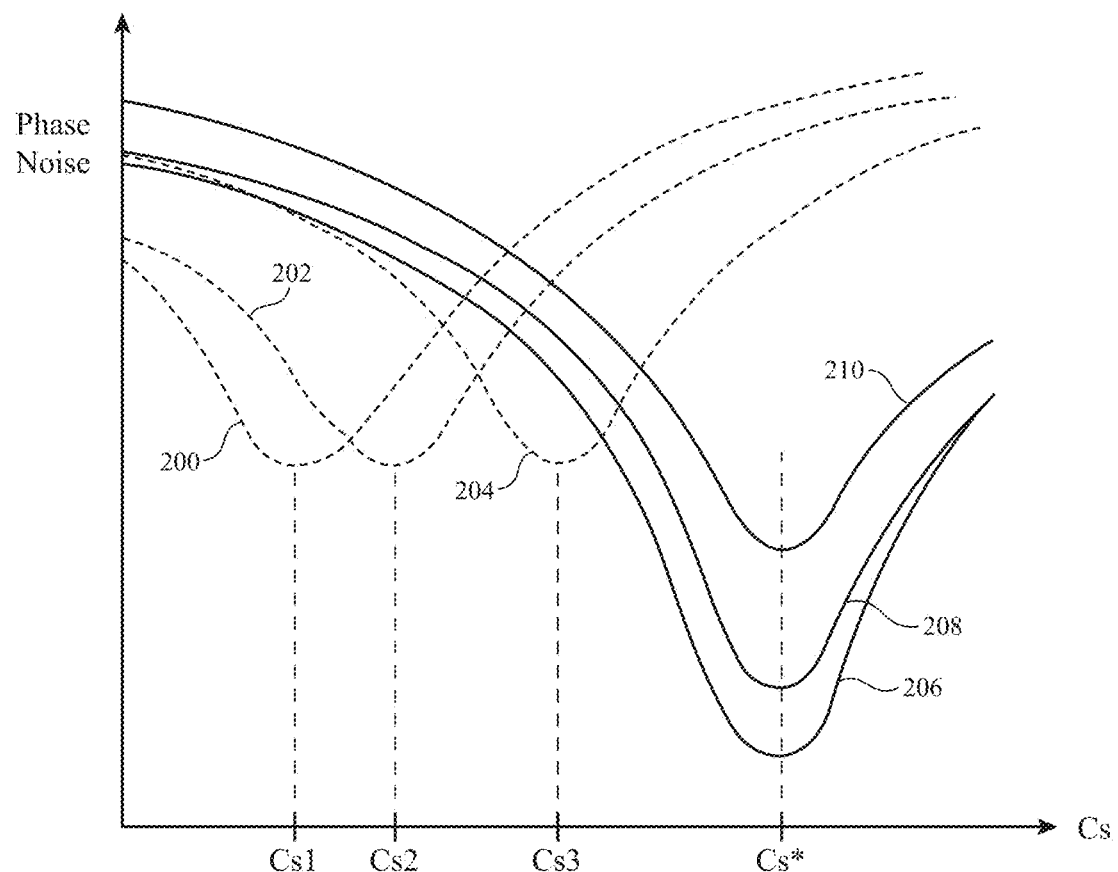
FIG. 7 is a plot showing how phase noise suppression can be improved by employing a transformer based tail filter in accordance with some embodiments.

The first tail coil Lsn may have a first terminal coupled to tail node Tn and a second terminal coupled to ground power supply line 66 via decoupling network 70. The second tail coil Lsp may have a first terminal coupled to tail node Tp and a second terminal coupled to positive power supply line 68 via decoupling network 70. As shown in FIG. 7, decoupling network 70 can include a decoupling capacitance Cdecap coupled between power supply lines 66 and 68, a first associated decoupling inductance Ldecap coupled in series with coil Lsn, a second associated decoupling inductance Ldecap coupled in series with Lsp, a first associated decoupling resistance Rdecap1 coupled between the first Ldecap and Cdecap, and a second associated decoupling resistance Rdecap2 coupled between the second Ldecap and Cdecap. A first parasitic capacitance Cparn may be coupled in parallel with tail coil Lsn, whereas a second parasitic capacitance Cparp may be coupled in parallel with tail coil Lsp.

As described in connection with FIG. 3, the tail coils Lsn and Lsp can be inductively coupled to tunable capacitor 72, forming a resonant tank. The resonant tank can exhibit a resonance at a resonant frequency. The resonant frequency can, if care is not taken, depend strongly on the decoupling inductance Ldecap. This can occur, for example, if a tunable capacitor is directly connected across the tail nodes Tn and Tp. Such configuration can pose challenges in predicting a common mode high frequency return path through the decoupling network as the tail inductances become smaller relative to Ldecap.

In accordance with an embodiment, the tail coils of oscillator circuitry 90 may be coupled to a differential tunable capacitor Cs via one or more transformers. As shown in FIG. 4, the first tail coil Lsn may be inductively coupled to a corresponding coil Ln, whereas the second tail coil Lsp may be inductively coupled to a corresponding coil Lp. Coils (windings) Lsn and Ln may form a first transformer 80, whereas coils (windings) Lsp and Lp may form a second transformer 82. First transformer 80 may represent a first 1:1 (one-to-one) impedance transformer, whereas second transformer 82 may represent a second 1:1 (one-to-one) impedance transformer. Coil Ln may have a first terminal coupled to the differential tunable capacitor Cs and may have a second terminal coupled to node 84. Coil Lp may have a first terminal coupled to the differential tunable capacitor Cs and may have a second terminal coupled to node 84.

Figure 5:
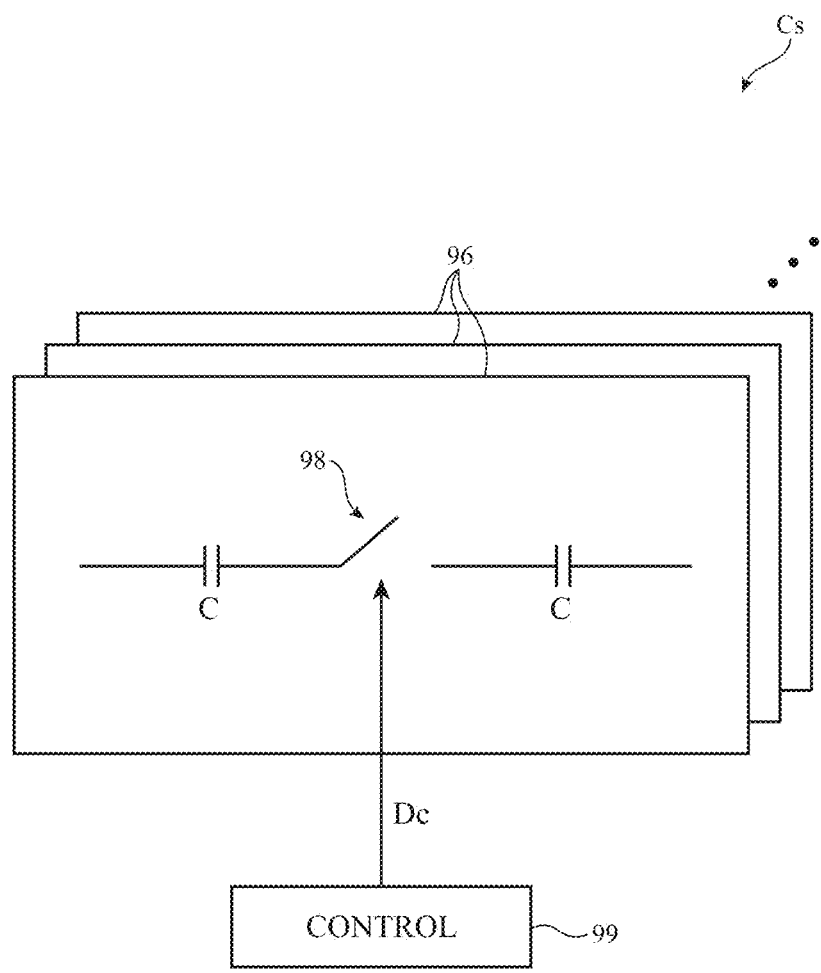
FIG. 5 is a circuit diagram of a differential tunable capacitor in accordance with some embodiments.

Tunable capacitor Cs can be implemented as a plurality (or bank) of differential switchable capacitor circuits (see, e.g., FIG. 5). As shown in FIG. 5, tunable capacitor Cs can be implemented as a plurality of differential switchable capacitor circuits 96 and can sometimes be referred to herein as a tunable capacitor circuit or a tunable capacitance. As shown in the example of FIG. 5, each switchable capacitor circuit 96 can include a switch 98 coupled between two capacitors C. Switchable capacitor circuits 96 can be controlled by a digital signal Dc configured to selectively activate and deactivate one or more switchable capacitor circuits 96 (e.g., a first subset of circuits 96 can be activated by turning on the switches 98 in the first subset, whereas a second subset of circuits 96 can be deactivated by turning off the switches 98 in the second subset). Digital signal Dc can be output by controller 99. Controller 99 can be part of control circuitry 14 of FIG. 1, processing circuitry 26 of FIG. 2, or transceiver circuitry 28 of FIG. 2. The single-ended to differential impedance transformation provided by transformers 80 and 82 can be leveraged to place the tunable capacitor Cs of the tail filter as a fully differential capacitor bank on the secondary side, which can be technically advantageous for exhibiting higher quality factor and smaller on resistance compared to a single-ended tunable capacitor, thus providing enhanced suppression of phase/flicker noise.

Components Lsn, Lsp, Ln, Lp, and Cs can collectively form a tail filter, sometimes referred to as a transformer based (tail) filter or a transformer based tail resonant circuit (tank). Coils Ln and Lp can sometimes be referred to and defined herein as filter coils. Arranged in this way, node 84 is configured as a virtual AC (alternating current) ground node. This configuration de-senses or reduces the impact of Ldecap by referring the differential tuning capacitor Cs between the opposing terminals of the tail inductor(s) through the 1:1 transformer circuitry. As a result, the resonant frequency of the transformer based tail filter becomes much less dependent on the decoupling network inductance Ldecap and capacitance Cdecap. This reduced dependence can be due to the phenomenon that any current or second harmonic power signals flowing through the tail nodes will be directed primarily through the transformer based resonant tank rather than through Ldecap (see, e.g., high frequency signal return path 92 flowing through the tail filter instead of through the decoupling network 70). Removing such dependence on Ldecap can be technically advantageous and beneficial since the tail resonator sizing (e.g., the sizing of components Lsn, Ln, Lp, Lsp, and/or Cs) can be optimized or increased to enhance the parallel resistance while reducing the overall phase noise for the wireless circuitry.

Figure 6:
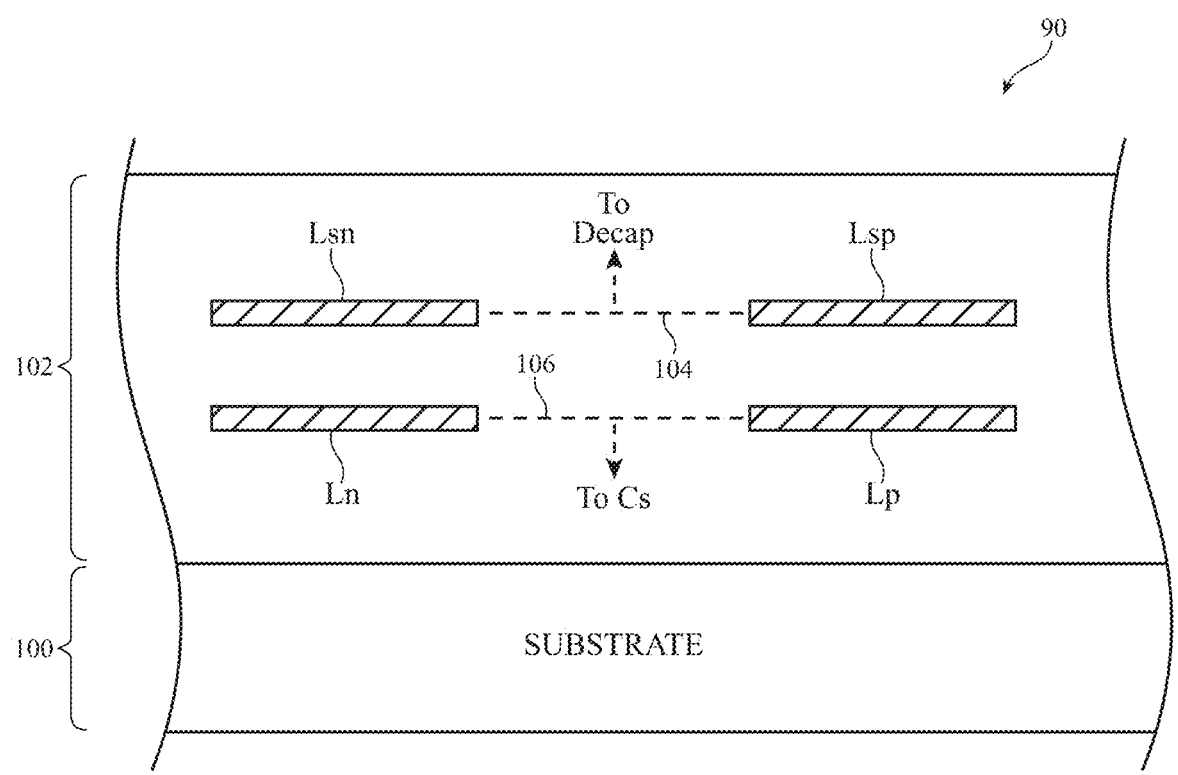
FIG. 6 is a side view of the coils within the transformer based tail filter of FIG. 4 in accordance with some embodiments.

FIG. 6 is a side view of the coils within the transformer based tail filter of FIG. 4. As shown in FIG. 6, oscillator circuitry 90 can include an interconnect stack such as interconnect stack 102 formed on a semiconductor substrate 100 (e.g., a p-type semiconductor substrate). Interconnect stack 102 may include alternating routing layers and via layers. Each routing layer can include conductive (metal) routing paths such as metal routing structures formed in a layer of dielectric material. Each via layer can include conductive (metal) vias such as metal via structures formed in a layer of dielectric material. Interconnect stack 102 is therefore sometimes referred to as a dielectric stack (e.g., an interconnect stack having conductive routing paths formed within dielectric material such as silicon dioxide). The conductive (metal) routing structures and the conductive (metal) via structures can be formed using copper, aluminum, tungsten, titanium, gold, silver, nickel, a metal alloy, a combination of metals, and/or other types of conductive material. The metal routing structures and the metal via structures can form an electrical network for interconnecting together various components within circuitry 90.

In the example of FIG. 6, coil Lsn may overlap with coil Ln (e.g., coil Lsn may be disposed directly over or on top of coil Ln, or vice versa). Similarly, coil Lsp may overlap with coil Lp (e.g., coil Lsp may be disposed directly over or on top of coil Lp, or vice versa). Overlapping the coils in this way to form the 1:1 impedance transformers can help reduce the circuit area of the tail filter. The tail coils Lsn and Lsp can be coupled to the decoupling network 70, as illustrated schematically by dotted connection path 104. The filter coils Ln and Lp can be coupled to tunable capacitor Cs, as illustrated schematically by dotted connection path 106. The example of FIG. 6 in which the tail coils Lsn and Lsp are disposed above the tail filter coils Ln and Lp within interconnect stack 102 is merely illustrative. In other embodiments, the tail coils Lsn and Lsp can be disposed below the tail filter coils Ln and Lp in the dielectric stack.

FIG. 7 is a plot showing how phase noise suppression can be improved by employing a transformer based tail filter of the type described in connection with FIGS. 1-6. Curves 200, 202, and 204 may represent phase noise profiles corresponding to an LC VCO having a tunable capacitor that is directly connected to the tail coils (i.e., if capacitor Cs had opposing terminals that are directly connected to tail nodes Tn and Tp). In particular, curve 200 corresponds to an LC VCO having a first Ldecap value, curve 202 corresponds to an LC VCO having a second Ldecap value different than the first Ldecap value, and curve 204 corresponds to an LC VCO having a third Ldecap value different than the first and second Ldecap values. As illustrated in FIG. 7, curve 200 exhibits optimal phase noise suppression when the tunable capacitance has a first value Cs1, curve 202 exhibits optimal phase noise suppression when the tunable capacitance has a second value Cs2, and curve 204 exhibits optimal phase noise suppression when the tunable capacitance has a third value Cs3. In other words, curves 200, 202, and 204 exhibit optimal phase noise suppression at different tunable capacitance Cs values. Such shift in Cs values when Ldecap values vary can result in the need for overdesigning the LC VCO.

In contrast, curves 206, 208, and 210 may represent phase noise profiles corresponding to oscillator circuitry 90 having transformer based tail filter of the type described in connection with FIGS. 1-6 (e.g., tunable capacitor Cs is inductively coupled to the complementary tail coils via one or more respective 1:1 impedance transformers). For example, curve 206 can correspond to oscillator circuitry 90 having a first Ldecap value, curve 208 can correspond to oscillator circuitry 90 having a second Ldecap value different than the first Ldecap value, and curve 210 can correspond to oscillator circuitry 90 having a third Ldecap value different than the first and second Ldecap values. As illustrated in FIG. 7, the various profiles 206, 208, and 210 all exhibit optimal phase noise suppression when the tunable capacitance has the same capacitance value Cs*. This can be due to the low resonance dependence on the Ldecap value. The use of one Cs value for varying Ldecap values can enable more flexibility and room for optimization in the design of the tail filter, which can result in improved phase noise suppression capabilities for the wireless circuitry.

The methods and operations described above in connection with FIGS. 1-7 may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 and/or wireless communications circuitry 24 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry in wireless circuitry 24, processing circuitry 18 of FIG. 1, etc.). The processing circuitry may include microprocessors, application processors, digital signal processors, central processing units (CPUs), application-specific integrated circuits with processing circuitry, or other processing circuitry.

The foregoing is illustrative and various modifications can be made to the described embodiments. The foregoing embodiments may be implemented individually or in any combination.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

What is claimed is:

1. Circuitry comprising:
    a pair of n-type transistors coupled to a first tail node;
    a pair of p-type transistors coupled to a second tail node;
    a load inductor coupled between the pair of n-type transistors and the pair of p-type transistors;
    a load capacitor coupled between the pair of n-type transistors and the pair of p-type transistors;
    a tunable capacitor;
    a first transformer coupled between the first tail node and the tunable capacitor; and
    a second transformer coupled between the second tail node and the tunable capacitor.

2. The circuitry of claim 1, wherein the first transformer comprises:
    a first tail coil having a first terminal coupled to the first tail node and having a second terminal coupled to a first power supply line.

3. The circuitry of claim 2, wherein the first transformer further comprises:
    a first filter coil having a first terminal coupled to the tunable capacitor and having a second terminal coupled to a node.

4. The circuitry of claim 3, wherein the second transformer comprises:
    a second tail coil having a first terminal coupled to the second tail node and having a second terminal coupled to a second power supply line different than the first power supply line.

5. The circuitry of claim 4, wherein the second transformer further comprises:
    a second filter coil having a first terminal coupled to the tunable capacitor and having a second terminal coupled to the node.

6. The circuitry of claim 5, wherein:
    the first tail coil and the first filter coil are formed vertically with respect to each other in an interconnect stack; and
    the second tail coil and the second filter coil are formed vertically with respect to each other in the interconnect stack.

7. The circuitry of claim 1, wherein:
    the first transformer comprises a first one-to-one impedance transformer; and
    the second transformer comprises a second one-to-one impedance transformer.

8. The circuitry of claim 1, wherein the tunable capacitor further comprises a plurality of switchable capacitor circuits.

9. The circuitry of claim 8, wherein at least one switchable capacitor circuit in the plurality of switchable capacitor circuits comprises a switch coupled between a pair of capacitors.

10. Oscillator circuitry configured to output oscillating signals, comprising:
    a first pair of cross-coupled transistors;
    a second pair of cross-coupled transistors;
    a load inductor coupled to the first and second pairs of cross-coupled transistors;
    a load capacitor coupled to the first and second pairs of cross-coupled transistors; and
    a transformer based tail filter coupled between the first and second pairs of cross- coupled transistors and including
        a first tail coil coupled to the first pair of cross-coupled transistors,
        a first filter coil inductively coupled to the first tail coil, and
        a differential tunable capacitor directly coupled to the first filter coil.

11. The oscillator circuitry of claim 10, wherein:
    the first pair of cross-coupled transistors comprises a pair of cross-coupled n-type transistors; and
    the second pair of cross-coupled transistors comprises a pair of cross-coupled p-type transistors.

12. The oscillator circuitry of claim 10, wherein the transformer based tail filter comprises:
    a second tail coil coupled to the second pair of cross-coupled transistors.

13. The oscillator circuitry of claim 12, wherein the transformer based tail filter further comprises:
    a second filter coil inductively coupled to the second tail coil.

14. The oscillator circuitry of claim 13, wherein the transformer based tail filter further comprises:
    a tunable capacitor having a first terminal coupled to the first filter coil and having a second terminal coupled to the second filter coil.

15. Oscillator circuitry comprising:

a first n-type transistor having a source terminal coupled to a first tail node and having a drain terminal coupled to a first output terminal;

a second n-type transistor having a source terminal coupled to the first tail node and having a drain terminal coupled to a second output terminal;

a first p-type transistor having a source terminal coupled to a second tail node and having a drain terminal coupled to the first output terminal;

a second p-type transistor having a source terminal coupled to the second tail node and having a drain terminal coupled to the second output terminal;

a first tail coil having a first terminal coupled to the first tail node and having a second terminal coupled to a first power supply line;

a second tail coil having a first terminal coupled to the second tail node and having a second terminal coupled to a second power supply line different than the first power supply line; and a first filter coil inductively coupled to the first tail coil.

16. The oscillator circuitry of claim 15, further comprising:

a load inductor coupled between the first and second output terminals; and a load capacitor coupled between the first and second output terminals.

17. The oscillator circuitry of claim 15, further comprising:

a second filter coil inductively coupled to the second tail coil.

18. The oscillator circuitry of claim 17, further comprising:

a tunable capacitor having a first terminal coupled to the first filter coil and having a second terminal coupled to the second filter coil.

19. The oscillator circuitry of claim 17, wherein the first and second filter coils are coupled together at a node configured as an alternating current (AC) ground node.

* * * * *